United States Patent [19]

Harris et al.

[11] Patent Number: 5,786,251
[45] Date of Patent: Jul. 28, 1998

[54] METHOD FOR PRODUCING A CHANNEL REGION LAYER IN A VOLTAGE CONTROLLED SEMICONDUCTOR DEVICE

[75] Inventors: Christopher Harris, Sollentuna; Mietek Bakowski, Skultuna; Lennart Zdansky, Västerås; Bo Bijlenga, Skultuna, all of Sweden

[73] Assignee: ABB Research Ltd., Zurich, Sweden

[21] Appl. No.: 678,548

[22] Filed: Jul. 9, 1996

[51] Int. Cl.$^6$ .................................... H01L 21/336
[52] U.S. Cl. .................. 438/268; 438/546; 438/931
[58] Field of Search ............................. 438/105, 192, 438/193, 268, 272, 274, 545, 546, 931

[56] References Cited

U.S. PATENT DOCUMENTS

| | | | |
|---|---|---|---|
| 4,757,028 | 7/1988 | Kondoh et al. | 438/931 |
| 5,202,273 | 4/1993 | Nakmura | 438/268 |
| 5,384,270 | 1/1995 | Ueno | 438/931 |
| 5,510,281 | 4/1996 | Ghezzo et al. | 438/268 |

*Primary Examiner*—Chandra Chaudhari
*Attorney, Agent, or Firm*—Pollock, Vande Sande & Priddy

[57] ABSTRACT

In a method for producing a channel region layer in a SiC-layer for providing a voltage-controlled semiconductor device a layer of silicon being one of a) polycrystalline and b) amorphous is applied on top of the SiC-layer, an aperture is etched in the silicon layer extending to the SiC-layer, a surface layer of a certain thickness of the silicon layer is oxidized, and the lateral extension of the channel region layer is determined by removing the oxidized layer and carrying out a further implantation into the area exposed by the so formed enlarged aperture.

9 Claims, 1 Drawing Sheet

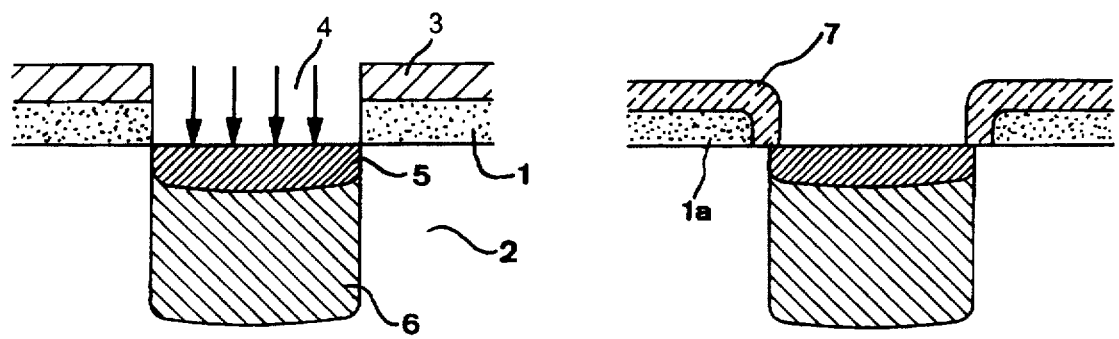
Fig 1
Fig 2
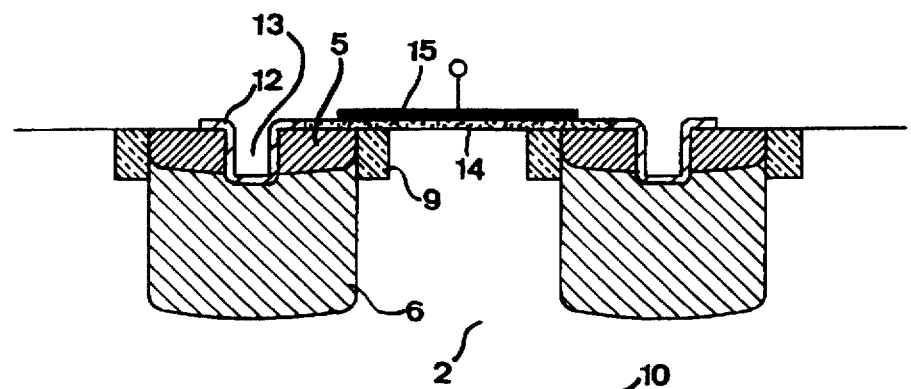
Fig 3
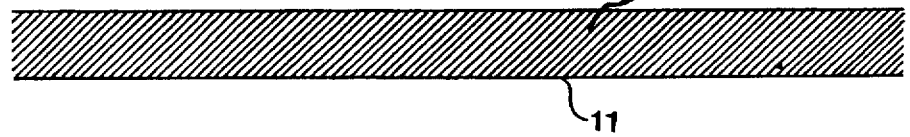
Fig 4
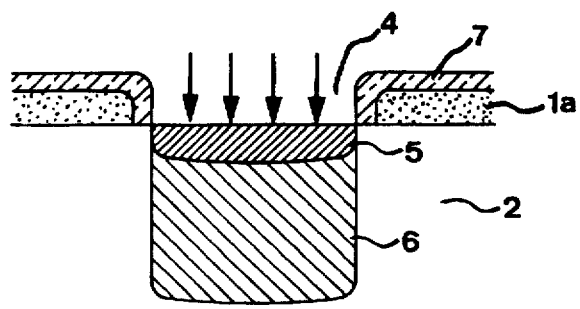
Fig 5

METHOD FOR PRODUCING A CHANNEL REGION LAYER IN A VOLTAGE CONTROLLED SEMICONDUCTOR DEVICE

TECHNICAL FIELD

The present invention relates to a method for producing a channel region layer of an opposite doping type, one of a) p and b) n, than the regions of laterally opposite sides thereof in a SiC-layer for providing a voltage controlled semiconductor device, as well as a voltage controlled semiconductor device produced by using such a method.

BACKGROUND OF THE INVENTION

The disclosed method may be used for producing any voltage controlled semiconductor device, such as for instance MISFETs, MOSFETs, and IGBTs. This type of semiconductor devices of SiC may especially be used as switching devices in power applications due to the possibility of turning them on and off very rapidly.

Such devices made of SiC are particularly well suited for high power applications, since such applications make it possible to benefit from the superior properties of SiC especially in comparison with Si, namely the capability of SiC to function well under extreme conditions. These properties, involving high thermal stability, high thermal conductivity and a high breakdown voltage are well known in the art.

However another well known feature of SiC, namely the extremely low diffusivity of dopants at convenient temperatures, has until now made it very difficult to produce a well defined channel region layer for a voltage controlled semiconductor device of SiC in a simple and reliable manner. For instance, with Si there is no problem producing such channel region layers since the diffusion technique functions excellently for Si.

SUMMARY OF THE INVENTION

The object of the present invention is to provide a method of the type defined in the introduction, which makes it possible to produce a well defined channel region layer in a voltage-controlled semiconductor device of SiC in a simple and thereby commercially interesting way.

This object is, according to the invention, obtained by providing such a method with the steps of:

1) applying a layer of silicon being one of a) polycrystalline and b) amorphous on top of the SiC-layer,
2) etching an aperture in the silicon layer extending to the SiC-layer,
3) oxidizing a surface layer of a certain thickness of the silicon layer,
4) implanting dopants of a first doping type, which corresponds to the doping type of the SiC-layer, into an area of the SiC-layer defined by the aperture in the silicon layer to obtain a high doping concentration of the first type in a first near-surface layer of the SiC-layer under the area,
5) removing the oxidized surface layer by etching and thereby increasing the aperture by the thickness of the oxidized layer,
6) implanting dopants of a second dopant type into an area of the SiC-layer defined by the aperture formed by step 5) to such a degree that the doping type of the near-surface layer created by carrying out step 4) is maintained but the doping type of a second near-surface layer under the area exposed by step 5) is changed to form a channel region layer with a lateral extension determined by the thickness of the oxidized silicon layer, wherein the steps are carried out in one of a) the order mentioned and b) the order mentioned, except for performing step 4) before step 3).

Thus, the invention is based on the idea of taking advantage that polysilicon or amorphous silicon has a much greater oxidation rate than SiC for forming a well defined channel region layer, which may be given a very short length in the sub-micron area when desired. Because of the fact that the oxidation rate for polysilicon and amorphous silicon is almost two orders of magnitude faster than for SiC, a negligible thickness of the SiC layer will be oxidized. A very important feature of the oxide layer zone created in the silicon layer is that it may be easily removed very accurately without touching any other structure of the device, so that this very precise way of enlarging the aperture in a mask for implantation will, in combination with the use of the self-aligned technique for forming the channel region layer by implantation, make it possible to obtain a well defined channel region layer having exactly the length desired for each particular device. The thickness of the oxidized silicon layer removed before the implantation determines the lateral extension of the channel region layer or the length of the channel so that the latter may be controlled by controlling the degree of oxidation of the silicon layer. Thus, it is possible to produce very short channels by a self-aligned technique that does not require any delicate process steps of very high accuracy. By using the formation of an oxide layer, and removal thereof for defining the width of a channel region layer, a non-directional process is utilized for obtaining the channel region layer which is of great importance. Thus, the advantages of a structure produced by this method is that it is possible to obtain a small cell size (pitch) of the channel region layer, enabling a high channel density without using any delicate technique requiring means able to carry out high-precisely process steps.

According to a preferred embodiment of the invention, the steps 1)–6) are carried out in the order mentioned, so that the channel region layer formed in step 6) gets the same lateral extension as the thickness of the oxidized silicon layer. This is advantageous due to the fact that the oxide layer will occupy a greater volume than the layer thereunder of polysilicon or amorphous silicon, so that material will in this way be saved, since less polysilicon or amorphous silicon has to be oxidized for a certain channel width. Provided that the oxidized layer is thick enough, this may then function as a mask for the implantations according to steps 4) and 6), which will reduce the number of masking steps and thereby result in a lower production cost of the device produced by utilizing this method.

According to another preferred embodiment of the invention, the dopants implanted in step 6) are of p-type for forming a doped p-type channel region layer laterally surrounded by n-type layers. This will mostly be convenient, since the SiC-layer will, when no dopants have been introduced therein during the epitaxy thereof, be n-doped.

According to another preferred embodiment of the invention, the method comprises a step carried out after step 2) but before step 5), and in which dopants of the second doping type are implanted deeply into the area defined by the aperture existing in the silicon layer for creating a deep layer of the second doping type under the first surface-near layer of the first doping type created in step 4). It will, in this way, by such a deep implantation, be possible to create a device having a DMOS-type of structure despite of the absence of the possibility to use the diffusion technique for obtaining such a device in SiC. A more appropriate name for such a device would be a VIMOS (a Vertical Implanted MOS), but it is emphasized that claim 4 also, of course, covers the case of producing other types of voltage controlled semiconductor devices of SiC having a deeply implanted layer, such as for instance IGBTs. The on-state performance of a device produced according to this method will be limited (for blocking voltages below 1 kV) by the carrier mobility of the channel formed in the implanted region.

According to another preferred embodiment of the invention, steps 1)–6) are carried out in the order mentioned, except that step 4) is carried out before step 3), and an additional masking layer is supplied on top of the silicon layer after carrying out step 1). Such an additional masking layer may be advantageous for preventing the ions accelerated towards the SiC-layer from reaching the SiC-layer in regions lying outside the aperture, since such ions may travel between grain boundaries in the silicon layer and reach the SiC-layer. Thus, it may be preferred to use such an extra masking layer, since a layer of polysilicon or amorphous silicon may, in some cases, not be a totally efficient mask. This is particularly valid when this embodiment is combined with the embodiment including the deep implantation due to the high acceleration energies used for such deep implantation.

According to another preferred embodiment of the invention, polycrystalline silicon is applied on top of the SiC-layer in step 1). The use of polycrystalline silicon for forming an oxidized layer to define the width of a channel region layer is preferred, since there are many chemical processes developed for polycrystalline silicon. Furthermore, there is a very diffuse border between polycrystalline silicon and amorphous silicon, and there may often be a mixture of these two types of silicon structure in a silicon layer applied in step 1), so that the definitions polycrystalline silicon and amorphous silicon will in this disclosure also cover the case in which the other one of the two is present and it will only mean that the one mentioned is in the majority.

The invention also comprises a method for producing a voltage controlled semiconductor device of SiC being one of a) a MISFET and b) an IGBT, the method comprising the steps of:

8) epitaxially growing, on top of each other, the following semiconductor layers of SiC: a highly doped substrate layer for a) of n-type and for b) of p-type, for b) on top thereof one of c) a highly doped n-type buffer layer and d) no such layer, and a low dope n-type drift layer;

9) carrying out the steps according to claim 1 according to one of two orders defined there, in which the first doping type is n and the second is p;

10) a step carried out after step 2) but before step 5), and in which dopants of p-type are implanted deeply into the area defined by the aperture existing in the silicon layer for creating a deep p-type base layer under the layer of n-type created in step 4), and forming a source region layer of the device;

11) removing the remaining silicon layer by etching;

12) applying an insulating layer onto the SiC-layer extending at least over the channel region layer, 13) applying a gate electrode on top of the insulating layer at least over the channel region layer and a source on the source region layer created in step 4).

A high quality MISFET or IGBT in SiC having a short channel and thereby a high channel density may, in this way, be produced in an easy and reliable manner.

The invention also involves voltage-controlled semiconductor devices of SiC produced by the method comprising the steps according to any of the appended method claims. The advantages of such a device will clearly appear from above.

Further advantages and preferred features of the invention will appear from the description and the claims.

BRIEF DESCRIPTION OF THE DRAWINGS

With reference to the appended drawings, below follows a specific description of preferred embodiments of the invention, cited as examples.

In the drawings:

FIGS. 1–3 are schematic cross section views illustrating different steps of a method for producing a channel region layer in a SiC-layer for producing a voltage-controlled semiconductor device according to a first preferred embodiment of the invention, FIG. 4 is a schematic cross section view illustrating how a voltage-controlled semiconductor device produced by utilizing the method steps illustrated in FIGS. 1–3 may look like, and FIG. 5 is a view illustrating how the steps shown in FIGS. 1 and 2 may be carried out in a method according to a second preferred embodiment of the invention.

DETAILED DESCRIPTION OF PREFERRED EMBODIMENTS

A method for producing a channel region layer in a SiC-layer for producing a voltage controlled semiconductor device will now be described with reference to FIGS. 1–3. Conventional semiconductor device producing steps having nothing to do with the invention, such as further steps of masking and demasking and so on, have for the purpose of clarity not been shown in the Figures.

First, a layer 1 of silicon, being polycrystalline or amorphous, is applied on top of a substantially monocrystalline SiC-layer 2, which here is a lightly doped layer of n-type. On top of the layer 1 a further layer 3 of a masking material, such as a metal, is applied. An aperture 4 is then etched through the layers 1 and 3 and to the surface of the SiC-layer 2. Then n-type dopants are implanted into an area of the SiC-layer defined by the aperture for obtaining a high doping concentration of donors in a near-surface layer 5 of the SiC-layer under said area. p-type dopants are also implanted into the area under the aperture 4, and this implantation is carried out while using high acceleration energies, to form a deep layer 6 with a high concentration of acceptors. The layers 5 and 6 may, in this way, be produced in an arbitrary order, and layers 1 and 3 will function as a mask for producing the layers 5 and 6 in alignment with each other.

The masking layer 3 is then removed and a surface layer 7 (see FIG. 2) of a certain thickness of the silicon layer 1 is then oxidized at high temperature, so that a layer 7 of oxide ($SiO_2$) is formed. The oxidation temperature for the polycrystalline or amorphous silicon is below 1000° C. at which temperature SiC does not oxidize significantly. It is indicated in FIG. 2 that the oxide occupies a somewhat greater volume than the silicon from which it derives, so that the oxide layer 7 will reduce the area of the aperture a little bit.

The oxidized surface layer 7 is then removed by wet etching, which may be done very accurately without touching any other structure. Then dopants of p-type are implanted into an area of the SiC-layer defined by the aperture 8 formed by the removal of the oxidized layer 7 to such a degree that the doping type of the near-surface layer 5 previously created is maintained but the doping type of a second near-surface layer 9 exposed through the removal is changed for forming a p-doped channel region layer 9 with a lateral extension determined by the thickness of the oxidized silicon layer 7. The remaining part of the layer 1a during this implantation functions as a mask. Thus, the thickness of the oxidized surface layer 7 will determine the width of the channel region layer 9, but in this case the width of the channel region layer will be a little bit smaller than the thickness due to the greater volume occupied by the $SiO_2$ than the polycrystalline or amorphous silicon. Channel region layers with a very short channel, well in the sub-micron region, may in this way be exactly produced in a very simple and reliable manner. The acceptors implanted are preferably B or Al, wherein P and N may be mentioned as possible donors for the n-type implantation.

FIG. 4 shows how a so called vertical implanted MOS (VIMOS) produced by carrying out a method according to a preferred embodiment of the invention may look like. This device is created by epitaxially growing a low doped n-type drift layer 2 on top of a highly doped n-type substrate layer 10, which is adapted to be connected to a drain indicated by a line 11 of the device. A highly doped p-type base layer 6, an n-type highly doped source region layer 5, and a p-type channel region layer 9 are formed by using the inventive method to produce a channel region layer in a SiC-layer for producing a voltage controlled semiconductor device. The device also includes a source contact 12 arranged in a groove 13 etched into the source region layer 5 through the base layer 6.

Furthermore, an insulating layer 14, for instance of $SiO_2$, is applied on top of the SiC-layer over at least the entire lateral extension of the channel region layer 9. Finally, a gate electrode 15 is applied upon the insulating layer 14 at least over the channel region layer 9. The function of such a device is well known to those skilled in the art, but it may be summarized here. When a voltage is applied to the gate electrode 15, a lateral conducting inversion channel is created at the interface 16 between the channel region layer 9 and the insulating layer 14 between the source region layer 5 and the drift layer 2, so that, provided that a voltage is applied over the source 12 and the drain 11 in the forward direction of the device, an electron current will flow from the source to the drain. FIG. 4 shows how several such devices may be placed next to each other to form a device together. An IGBT may be designed in the same way, but there will be an extra highly-doped p-type substrate layer below the drift layer, possibly with a highly doped n-type buffer layer therebetween.

FIG. 5 shows how the method for producing a channel region layer in a SiC-layer for producing a voltage controlled semiconductor device may be modified with respect to the method described above. In this case, the oxidation of a surface layer 7 is carried out directly after producing the aperture 4 therein, and no further masking layer, as the layer 3 in FIG. 1, is applied in this case. The implantations forming the layers 5 and 6 are carried out after the oxidation step. The advantage of this procedure is that the thickness of the oxidized surface layer 7 will be identical to the width of the channel region layer formed by removing the surface layer 7 and carrying out a further implantation of acceptors, so that there will be a minimum of waste of material with respect to the layer 1 of polycrystalline or amorphous silicon. The length of the channel created according to the invention may typically be about 0.5 μm, and the deep implantation may be carried out to a depth of for example 2 μm.

The invention is, of course not in any way restricted to the preferred embodiments described above, but many possibilities to modifications thereof will be apparent for one skilled in the art without departing from the basic idea of the invention.

It is emphasized that the thicknesses of different layers in the Figures cannot be interpreted as limiting the scope of the protection, but any thickness relations are intended to be covered by the claims.

The dopant used may be of any material suitable as dopants for this application, and it is possible to change the doping type to the opposite ones than those shown in the preferred embodiments described above should this be desired.

The methods according to the invention of course also include annealing steps for making the dopants implanted electrically active, but how and when these are carried is irrelevant to the invention.

The number of layers mentioned in the claims is a minimum number, and it is within the scope of the invention to arrange further layers in the device or dividing any layer into several layers by selective doping of different regions thereof.

The deep implantation step, as well as the layer created thereby, may be left out, or a corresponding layer may be produced by another technique, such as epitaxial regrowth, although the implantation according to the preferred embodiment described above is very advantageous.

"Substrate layer" is in this disclosure to be interpreted as the layer closest to the drain of the layers mentioned, and it does not have to be a substrate layer in the strict sense of this word within this field, i.e. the layer from which the growth is started. The real substrate layer may be any of the layers and is mostly the thickest one, which may be the drift layer.

The layers located on top of each other do not have to be epitaxially grown in the order mentioned in the claims, but any other order of growth of these layers is deemed to be within the scope of the claims. For instance, the method may be started from the drift layer and the so-called substrate layer and the drain may be grown at the very end of the method.

We claim:

1. A method for producing a channel region layer having a doping opposite to that of the regions on laterally opposite sides thereof in a SiC-layer for producing a voltage-controlled semiconductor device, said method comprising the steps of:

1) applying a layer of silicon being one of a) polycrystalline and b) amorphous on top of the SiC-layer;

2) etching an aperture in said silicon layer to extend to the SiC-layer;

3) oxidizing a surface layer of a certain thickness of said silicon layer;

4) implanting dopants of a first doping type, which corresponds to the doping type of the SiC-layer, into an area of the SiC-layer defined by said aperture in said silicon layer to obtain a high doping concentration of said first type in a first near-surface layer of the SiC-layer under said area, 5) removing said oxidized surface layer by etching and thereby increasing said aperture by the thickness of said oxidized layer;

6) implanting dopants of a second dopant type into an area of the SiC-layer defined by the aperture formed by step 5) to such a degree that the doping type of said near-surface layer created by carrying out step 4) is maintained but the doping type of a second near-surface layer under the area exposed through step 5) is changed to form a channel region layer with a lateral extension determined by the thickness of the oxidized silicon layer, wherein the steps are carried out in one of a) the above order and b) the above order, except for step 4) performed before step 3).

2. A method according to claim 1, wherein steps 1)–6) are carried out in the above order, such that the channel region layer formed in step 6) has the same lateral extension as the thickness of the oxidized silicon layer.

3. A method according to claim 1 wherein the dopants implanted in step 6) are of p-type to form a doped p-type channel region layer laterally surrounded by n-type layers.

4. A method according to claim 1, further comprising a step carried out after step 2) but before step 5), in which dopants of said second doping type are implanted deeply into the area defined by the aperture extending in said silicon layer for creating a deep layer of said second doping type under the first near-surface layer of the first doping type created in step 4).

5. A method according to claim 1, wherein the steps 1)–6) are carried out in the above order, except for that step 4) is carried out before step 3), and an additional masking layer is applied on top of said silicon layer after carrying out step 1).

6. A method according to claim 5, wherein said additional masking layer is removed after step 4) and before step 3) is carried out.

7. A method according to claim 1, wherein polycrystalline silicon is applied on top of the SiC-layer in step 1).

8. A method according to claim 1, wherein said surface layer of said silicon layer is in step 3) oxidized while being heated at a high temperature.

9. A method for producing a voltage controlled semiconductor device of SiC being one of a) a MISFET and b) an IGBT, comprising the steps of:

8) epitaxially growing on top of each other the following semiconductor layers of SiC: a highly doped substrate layer being for a) of n-type and for b) of p-type, for b) on top thereof one of c) a highly doped n-type buffer layer and d) no such layer, and a low doped n-type drift layer, 9) carrying out the steps of claim 1 according to one of two orders defined therein, in which the first doping type is n-type and the second is p-type, further comprising the following steps:

10) a step carried out after step 2) but before step 5), in which dopants of p-type are implanted deeply into the area defined by the aperture extending in said silicon layer to create a deep p-type base layer under the layer of n-type created in step 4) and forming a source region layer of the device, 11) removing the remaining silicon layer (1a) by etching, 12) applying an insulating layer onto the SiC-layer extending at least over said channel region layer, and 13) applying a gate electrode on top of said insulating layer at least over said channel region layer and a source on said source region layer created in step 4).

* * * * *